(12) United States Patent
Lopez Villanueva et al.

(10) Patent No.: US 11,970,647 B2
(45) Date of Patent: Apr. 30, 2024

(54) COMPOSITION, ITS USE AND A PROCESS FOR SELECTIVELY ETCHING SILICON-GERMANIUM MATERIAL

(71) Applicant: BASF SE, Ludwigshafen am Rhein (DE)

(72) Inventors: Francisco Javier Lopez Villanueva, Ludwigshafen (DE); Yeni Burk, Ludwigshafen (DE); Daniel Loeffler, Ludwigshafen (DE); Jan Ole Mueller, Ludwigshafen (DE); Marcel Brill, Ludwigshafen (DE); Patrick Wilke, Ludwigshafen (DE); Jean-Pierre Berkan Lindner, Ludwigshafen (DE); Volodymyr Boyko, Ludwigshafen (DE)

(73) Assignee: BASF SE, Ludwigshafen am Rhein (DE)

(*) Notice: Subject to any disclaimer, the term of this patent is extended or adjusted under 35 U.S.C. 154(b) by 64 days.

(21) Appl. No.: 17/624,872

(22) PCT Filed: Jun. 19, 2020

(86) PCT No.: PCT/EP2020/067146
§ 371 (c)(1),
(2) Date: Jan. 5, 2022

(87) PCT Pub. No.: WO2021/004759
PCT Pub. Date: Jan. 14, 2021

(65) Prior Publication Data
US 2022/0290050 A1    Sep. 15, 2022

(30) Foreign Application Priority Data
Jul. 8, 2019  (EP) ..................... 19184952

(51) Int. Cl.
*C09K 13/08* (2006.01)
*C09K 13/00* (2006.01)
*H01L 21/306* (2006.01)
*H01L 21/311* (2006.01)
*H01L 21/3213* (2006.01)

(52) U.S. Cl.
CPC .............. *C09K 13/08* (2013.01); *C09K 13/00* (2013.01); *H01L 21/30604* (2013.01); *H01L 21/31111* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 7,709,277 B2 | 5/2010 | Lee et al. | |
| 8,461,055 B2 | 6/2013 | Radouane et al. | |
| 9,076,732 B2 | 7/2015 | Tiec et al. | |
| 10,106,737 B2 | 10/2018 | Dictus et al. | |
| 2010/0112728 A1* | 5/2010 | Korzenski | H01L 21/02079 257/E21.294 |
| 2012/0032108 A1 | 2/2012 | Stockum et al. | |
| 2016/0293289 A1 | 10/2016 | Stockum et al. | |
| 2017/0362466 A1* | 12/2017 | Shi | H01L 21/3212 |
| 2018/0163130 A1 | 6/2018 | Kim et al. | |
| 2018/0294165 A1 | 10/2018 | Bilodeau | |
| 2020/0172808 A1* | 6/2020 | Bjelopavlic | H01L 21/30604 |

FOREIGN PATENT DOCUMENTS

| | | |
|---|---|---|
| WO | 2016062578 A1 | 4/2016 |
| WO | 2017007893 A1 | 1/2017 |
| WO | 2018206239 A1 | 11/2018 |
| WO | 2018206758 A1 | 11/2018 |

OTHER PUBLICATIONS

European Search Report for EP Patent Application No. 19184952.0, dated Dec. 20, 2019, 3 pages.
International Search Report and Written opinion for corresponding PCT/EP2020/067146 dated Aug. 12, 2020, 10 Pages.

* cited by examiner

*Primary Examiner* — Jiong-Ping Lu
(74) *Attorney, Agent, or Firm* — Armstrong Teasdale LLP

(57) ABSTRACT

Described herein is a composition for selectively etching a layer including a silicon germanium alloy (SiGe) in the presence of a silicon-containing layer, particularly a layer comprising a-Si, SiOx, SiON, SiN, or a combination thereof, the composition including:
(a) an oxidizing agent,
(b) an acid selected from an inorganic acid and an organic acid,
(c) an etchant including a source of fluoride ions,
(d) a polyvinylpyrrolidone (PVP), and
(e) water.

18 Claims, No Drawings

COMPOSITION, ITS USE AND A PROCESS FOR SELECTIVELY ETCHING SILICON-GERMANIUM MATERIAL

CROSS-REFERENCE TO RELATED APPLICATIONS

This application is a U.S. National Phase Application of Internatinoal Patent Application No. PCT/EP2020/067146, filed Jun. 19, 2020, which claims priority to European Patent Application No. 19184952.0, filed Jul. 8, 2019, the entire contents of which are hereby incorporated by reference herein.

The present invention relates to a composition, its use and a process for selectively etching silicon-germanium material at a surface of a microelectronic device substrate, relative to etching a silicon material at the same surface.

BACKGROUND OF THE INVENTION

Steps of preparing certain microelectronic devices, e.g., integrated circuits, may include selectively removing silicon-germanium (SiGe) material from a surface that contains the SiGe in combination with silicon (Si). According to certain example fabrication steps, SiGe may be used as a sacrificial layer in a structure that also contains silicon. Based on such fabrication steps, advanced device structures may be prepared, such as silicon nanowires and silicon on nothing (SON) structures. Steps in these processes include epitaxial deposition of a structure of alternating layers of Si and SiGe, followed by patterning and, eventually, selective lateral etching to remove the SiGe layers and generate a three-dimensional silicon structure.

In certain specific methods of preparing a field effect transistors (FET) for an integrated circuit, silicon (Si) and silicon-germanium (Si Ge) materials are deposited as layers onto a substrate, i.e., as an "epitaxial stack" of Si and SiGe. The layers are subsequently patterned using standard techniques, such as by use of a standard lithographically generated mask. Next, a directional isotropic etch may be useful to laterally etch away the sacrificial SiGe material, leaving behind a silicon nanowire or sheet structure.

To enable smaller structures within Semiconductor structures electronic industry is searching for solutions to remove SiGe layers selectively against $SiO_2$, amorphous silicon (a-Si), SiN, SioN or a combination thereof. This is needed to realize well defined nanowire or nanosheet structures.

U.S. Pat. No. 7,709,277 B2 discloses an etching composition that may comprise peroxyacetic acid, hydrofluoric acid, a buffer, such as acetic acid, a secondary oxidizer, a surfactant and a polymer, such as polyethyleneimine, polylysine, polyacrylic acid, polyacrylamide, poly(methacrylic acid), poly(diethylaminoethyl methacrylate) and poly(dimethylaminoethyl methacrylate).

US 2018/0294165 discloses a method for selectively removing SiGe that uses a composition comprising hydrogen fluoride, hydrogen peroxide, acetic acid, formic acid, and sulfuric acid.

U.S. Pat. No. 9,076,732 B2 discloses a SiGe etching composition comprising hydrofluoric acid, hydrogen peroxide, acetic acid, and ammonia.

U.S. Pat. No. 8,461,055 discloses a SiGe etching composition comprising hydrofluoric acid, hydrogen peroxide, acetic acid, and sulfuric acid.

However, the state-of-the-art solutions are not able to fulfil all requirements since they have at least one of the following deficiencies:

(a) a too low SiGe/Si selectivity, to remove the SiGe layer(s) without attacking the Si layer;
(b) a too low etch rate which leads to a long time to completely remove the SiGe layer(s);
(c) a too high SiOx, SiON, SiN etch rate; and/or
(d) a long incubation/ripening time.

It is therefore an object of the invention to increase the SiGe/Si selectivity without reducing the etch rate with respect to SiGe too much and to avoid a long incubation/ripening time.

SUMMARY OF THE INVENTION

It has now been found that the use of polyvinylpyrrolidone (PVP) and its derivatives significantly and selectively improve the SiGe/Si selectivity since the etching rate of silicon containing layers, particularly $SiO_2$, a-Si, SiN or SiON layers is much more reduced than the etching of the SiGe layer.

Therefore, one embodiment of the present invention is a composition comprising or consisting of
(a) an oxidizing agent,
(b) an acid selected from an inorganic acid and an organic acid,
(c) an etchant comprising a source of fluoride ions,
(d) a polyvinylpyrrolidone (PVP), and
(e) water.

It was particularly surprising that the etching composition according to the invention is suited to allow for a very controlled and selective etching of layers comprising or consisting of SiGe alloys, preferably of a SiGe25 layer, even of thin or ultra-thin layers comprising germanium ("Ge layers"), particularly layers comprising or consisting of SiGe alloys, while at the same time not or not significantly compromising silicon-containing layers, particularly layers comprising or consisting of amorpous silicon (a-Si), $SiO_x$, SiN, SiON or a combination thereof.

Another embodiment of the present invention is the use of the compositions described herein for selectively etching a layer comprising SiGe in the presence of a silicon-containing layer, particularly a layer comprising or consisting of a-Si, $SiO_x$, SiN, SiON, or a combination thereof.

Yet another embodiment of the present invention is a process for selectively removing a layer comprising silicon-germanium from a surface of a microelectronic device relative to a silicon-containing layer, particularly a layer comprising or consisting of a-Si, $SiO_x$, SiN, SiON, or a combination thereof, the process comprising:
(a) providing a microelectronic device surface that includes silicon and silicon-germanium,
(b) providing a composition as described herein, and
(c) contacting the surface with the composition for a time and at a temperature effective to selectively remove the layer comprising silicon-germanium relative to the silicon-containing layer.

DETAILED DESCRIPTION OF THE INVENTION

The purpose of the etching composition is etching of germanium-containing layers in the presence of silicon-containing layers.

Definitions

As used herein, "silicon-containing layer" or "Si layer" include, but is not limited to, a layer comprising or consisting of amorphous or crystalline silicon; p-doped silicon; n-doped silicon; silicon oxide ($SiO_x$), including gate oxides (e.g., thermally or chemically grown $SiO_2$) and TEOS; silicon nitride (SiN); silicon oxynitride (SiON); thermal oxide; SiOH; SiCOH; titanium silicide; tungsten silicide; nickel silicides; cobalt silicides; and low-k dielectric materials. The etching composition is particularly useful when etching SiGe in the presence of amorphous silicon (a-Si), $SiO_x$, SiON, and SiN. It should be appreciated that for the purpose of this application, silicon-containing materials or layers do not include substantial amounts of germanium, i.e., the silicon-containing materials contain less than 5% by weight germanium, preferably less than 2% by weight germanium, more preferably less than 1% by weight germanium, even more preferably less than 0.1% by weight germanium, most preferably essentially no germanium, i.e. devoid of any amounts of germanium that influence the etching of the layer.

As used herein, the "silicon oxide" or "$SiO_x$" layers correspond to layers that were deposited from a silicon oxide precursor source, e.g., TEOS, thermally deposited silicon oxide, or carbon doped oxides (CDO) deposited using commercially available precursors such as SiLK™, AURORA™, CORAL™ or BLACK DIAMOND™. "Silicon oxide" is meant to broadly include SiO&, CDO's, siloxanes and thermal oxides. Silicon oxide or $SiO_x$ material corresponds to pure silicon oxide ($SiO_2$) as well as impure silicon oxide including impurities in the structure.

As used herein, the "silicon-germanium-containing layers" or "SiGe layers" correspond to layers comprising or consisting of silicon-germanium (SiGe) alloys known in the art and represented by the formula: $Si_xGe_y$, wherein x is in a range from about 0.70 to 0.90, and y is in a range from about 0.10 to about 0.30, with x+y=1.00. SiGe25 here means that y is 0.25.

As used herein, the formula SiGe will be used to signify the silicon germanium material to be removed.

As used herein, the term "selectively etching" (or "selective etch rate") preferably means that upon applying a composition according to the invention to a layer comprising or consisting of a first material, in this case SiGe, in the presence of a layer comprising or consisting of a second material, in this case a-Si, $SiO_x$, SiON or SiN, the etch rate of said composition for etching the first layer is at least 10 times, preferably at least 100 times, the etch rate of said composition for the second layer.

As used herein, the term "layer" here means a part of a substrate that was separately disposed on the surface of a substrate and has a distinguishable composition with respect to adjacent layers.

Oxidizing Agent

The etching composition according to the invention comprises an oxidizing agent. The oxidizing agent, also referred to as oxidizer, may be any oxidizer that is capable of oxidizing Germanium within Silicon Germanium alloys.

Oxidizing agents contemplated herein include, but are not limited to, hydrogen peroxide, $FeCl_3$, $FeF_3$, $Fe(NO_3)_3$, $Sr(NO_3)2$, $CoF_3$, $MnF_3$, oxone ($2KHSO_5$ $KHSO_4$ $K_2SO_4$), periodic acid, iodic acid, vanadium (V) oxide, vanadium (IV, V) oxide, ammonium vanadate, ammonium peroxymonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxymonosulfate, peroxymonosulfuric acid, ferric nitrate, urea hydrogen peroxide, peracetic acid, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1, 4-benzoquinone (DMBQ), chloranil, alloxan, N-methylmorpholine N-oxide, trimethylamine N-oxide, and combinations thereof. The oxidizing species may be introduced to the composition at the manufacturer, prior to introduction of the composition to the device wafer, or alternatively at the device wafer, i.e., in situ.

Preferably the oxidizing agent comprises or consists of a peroxide. Useful peroxides may be but are not limited to hydrogen peroxide or peroxymonosulfuric acid and organic acid peroxides like peroxyacetic acid, and their salts.

The most preferred oxidizing agent is hydrogen peroxide, peroxyacetic acid or a combination thereof.

In a particular embodiment the oxidizing agent is prepared by mixing and having reacted hydrogen peroxide and acetic acid, preferably in the presence of a strong inorganic acid, to form a peroxyacetic acid mixture as described in US 2018/0163130 A1, which is incorporated herein by reference. The reaction time to form the peroxyacetic acid depends on the specific composition and need to be determined by experiment.

As used herein, "strong inorganic acid" herein means an inorganic acid with a $pK_a$ of 2 or less, preferably 1 or less. Strong inorganic acids may be but are not limited to sulfuric acid, hydrochloric acid, phosphonic acid, and the like. Sulfuric acid is particularly preferred.

By way of example, the peroxyacetic acid may be prepared by mixing 91 parts by volume acetic acid (100%), 72 parts by volume hydrogen peroxide (31%) and 1 part by volume sulfuric acid (96%). This mixture will equilibrate at room temperature to a solution containing 16% by weight peroxyacetic acid as described in "The Chinese Journal of Process Engineering, Vol. 8, No. 1, 2018, 35-41". The reaction time at room temperature (23° C.) is usually in the range of from 12 h to 7 d, preferably of from 1 d to 5 d, most preferably from 3 d to 4 d.

The amount of peroxyacetic acid formed in the peroxyacetic acid mixture depends on the specific conditions and concentration of hydrogen peroxide and acetic acid. Usually the concentration of peroxyacetic acid in the peroxyacetic acid mixture is of from about 5% to about 30% by weight, preferably of from about 10% to about 30% by weight, most preferably of from about 12% to about 30% by weight.

The peroxyacetic acid mixture may be present in the final etching composition in an amount of from about 5% to about 50% by weight, preferably of from about 10% to about 40% by weight, more preferably of from about 12% to about 28% by weight, most preferably of from about 15% to about 25% by weight.

In the final etching composition, the oxidizing agent(s) may be present in the etching composition in an amount of from about 0.01 to about 3.0 mol/l, preferably of from about 0.05 to about 2.0 mol/l, more preferably of from about 0.1 to about 1.5 mol/l, most preferably of from about 0.2 to about 1.0 mol/l.

The concentration of sulfuric acid in the final etching mixture should preferably be lower than 1% by weight, preferably lower than 0.5% by weight, even more preferably lower than 0.3% by weight, most preferably lower than 0.2% by weight. Reducing the concentration of sulfuric acid reduces the etching rate of $SiO_x$ and further increases the selectivity SiGe vs $SiO_x$.

A particular embodiment relates to a process for preparing an etching composition described herein, the process comprising:
(a) preparing a peroxyacetic acid mixture by mixing a peroxide, an acetic acid and optionally an inorganic acid and having reacted the peroxide with the acetic acid for a time sufficient to form peroxyacetic acid;
(b) mixing the peroxyacetic acid mixture with an etchant comprising a source of fluoride ions, and a polyvinylpyrrolidone (PVP) and optionally other components as described herein.

Etchant

The etching composition according to the invention comprises a source of fluoride ions which may be any compound that is capable of releasing fluoride ions.

Preferred etchants are selected from but not limited to the group consisting of ammonium fluoride, ammonium bifluoride, triethanolammonium fluoride, diglycolammonium fluoride, methyldiethanolammonium fluoride, tetramethylammonium fluoride, triethylamine trihy-drofluoride, hydrogen fluoride, fluoroboric acid, tetrafluoroboric acid, ammonium tetra-fluoroborate, fluoroacetic acid, ammonium fluoroacetate, trifluoroacetic acid, fluorosilicic acid, ammonium fluorosilicate, tetrabutylammonium tetrafluoroborate, and mixtures thereof. Preferably the etchant consists of one or more, most preferably one of the said compounds.

Most preferably the etchant comprises or consists of hydrogen fluoride.

The etching compositions according to the invention comprising hydrogen fluoride as the etchant have shown a stable and reproducible controlled selective etch rate for etching a layer comprising or consisting of SiGe, in particular SiGe25, in the presence of a layer of a-Si, $SiO_x$, SiON or SiN.

The etchant may be present in the etching composition in an amount of from about 0.001 to about 3 mol/l, preferably of from about 0.005 to about 1 mol/l, more preferably of from about 0.01 to about 0.5 mol/l, most preferably of from about 0.015 to about 0.15 mol/l.

If the etchant is hydrogen fluoride, the etchant may preferably be used in an amount of from about 0.001 to about 5% by weight, preferably of from about 0.01 to about 1% by weight, more preferably of from about 0.02 to about 0.5% by weight, most preferably of from about 0.05 to about 0.3% by weight, based on the total weight of the composition.

Compositions according to the invention comprising the etchant in the here defined preferred total amounts have shown a superior balance of acceptable etch rate, in particular for etching a layer comprising or consisting of SiGe, preferably of SiGe25, and etch rate selectivity, in particular in the presence of a layer comprising or consisting of a-Si, $SiO_x$, SiON or SiN.

Acid

The etching composition according to the invention further comprises an acid. Such acid may be an inorganic acid, an organic acid, or a combination thereof. Preferably the acid is an organic acid or a combination of an inorganic acid and an organic acid.

Typical inorganic acids may be selected from but are not limited to sulfuric acid or phosphoric acid. Preferably, the inorganic acid comprises or consists of a strong inorganic acid, particularly sulfuric acid.

Typical organic acids may be selected from but are not limited to $C_1$ to $C_{10}$ mono, di or tri carboxylic acids, sulfonic acids, phosphonic acids, and the like. Preferably, the organic acid comprises or consists of acetic acid.

The acid may be present in the etching composition in an amount of from of from 10% to 60% by weight, more preferably of from 20% to 55% by weight, most preferably of from 30 to 50%.

In a particularly preferred embodiment the acid is a combination of an inorganic acid and an organic acid. Preferably the concentration of the inorganic acid is about 1% by weight or below, more preferably about 0.5% by weight or below, most preferably of from about 0.1 to about 0.5% by weight and the concentration of the organic acid is of from about 10 to about 60% by weight, more preferably of from about 20 to about 55% by weight, most preferably of from about 30 to about 50% by weight. Most preferably the acid is selected from a combination of sulfuric acid and acetic acid.

SiGe Selectivity Enhancers

The etching composition according to the invention further comprises one or more selectivity enhancers.

Polyvinylpyrrolidone

By using a polyvinylpyrrolidone (PVP) the SiGe etching over Si, particularly a-Si, is significantly increased compared to the prior art etching compositions. As used herein, "polyvinylpyrrolidone" or "PVP" mean homopolymers and copolymers of N-vinylpyrrolidone and derivatives thereof.

PVP as such is a homopolymer received by polymerization of N-vinylpyrrolidone. It is available in the market e.g. from BASF under the trade name LUVITEC® K.

The K value of the PVP, an indicator of its viscosity, may be of from about 8 to about 100, preferably of from about 10 to about 40, most preferably from about 12 to about 20.

The weight-average molecular weight $M_w$ of the PVP may be from about 3 to about 3 000 kg/mol, preferably from about 4 to about 1 700 kg/mol, more preferably from about 4 to about 500 kg/mol, even more preferably from about 5 to about 100 kg/mol, most preferably from about 5 to about 50 kg/mol.

Alternatively, co-polymers of N-vinylpyrrolidone with other vinylic compounds may be used. Such other vinylic compounds may be but are not limited to vinyl acetate, acrylic or methacrylic acid or its derivatives like methyl methacrylate, or styrene. The content of N-vinylpyrrolidone in the co-polymers may be of from about 10 to about 99.9% by weight, preferably from about 50 to about 99.9% by weight, even more preferably from about 70 to about 99.9% by weight. Such co-polymers may have block, random, or alternating structure.

The PVP may be present in the etching composition in an amount of from about 0.01 to about 10% by weight, preferably of from about 0.1 to about 5% by weight, more preferably of from about 0.2 to about 3% by weight, most preferably of from about 0.5 to about 2% by weight.

Polylysine

The etching composition may optionally comprise a polylysine. By using a combination of a polyvinylpyrrolidone (PVP) and a polylysine the SiGe etching over a-Si can be further increased.

As used herein, "polylysine" mean homopolymers and copolymers of lysine and derivatives thereof, preferably homopolymers of lysine.

Polylysine, is a homopolymer of lysine that may be produced from lysine by a basic polycondensation reaction.

Polylysine and derivatives thereof may be prepared from L-Lysine as described in WO 2018/206239 or WO 2018/206758.

Preferably the polylysine is non-crosslinked. In one embodiment, the nonmodified and/or modified polylysine is non-crosslinked. "Non-crosslinked" means that that there is no deliberate cross-linking in the sense of formation of covalent bounds between single polylysine derivative molecules or modified polylysine derivative molecules introduced. Therefore, essentially no cross-links are introduced by the process of production as such. Essentially no cross-links may mean that the degree of cross-linking is low, such as below 5%, which might be due to cross-linking substances being present in the reaction mixture as impurities of the aqueous lysine solution, such as arginine.

The polylysine may have a weight average molecular weight $M_w$ of about 500 g/mol to about 85 000 g/mol, preferably of about 1000 g/mol to about 60 000 g/mol, even more preferably in the range of about 1 000 g/mol to about 5 000 g/mol, even more preferably of about 2 000 g/mol to about 4 000 g/mol, most preferably of about 2 500 g/mol to about 3 500 g/mol. The polylysine or its derivative may also have a weight-average molecular weight $M_w$ of about 5 000 g/mol to about 10 000 g/mol, of about 10 000 g/mol to about 55 000 g/mol, or of 40 000 g/mol to 50 000 g/mol. The weight-average molecular weight in this context is to be determined by size exclusion chromatography (SEC or GPC) using hexafluoro isopropanol.

In one embodiment, the polylysine may have a polydispersity $M_w/M_n$ of about 1.2 to about 3.0. The polylysine or its derivative may have a polydispersity index of about 1.3 to about 2.6, of about 1.4 to about 2.4, of about 1.5 to about 2.2, or of about 1.6 to about 2.0.

In one embodiment, the non-modified and/or modified polylysine has a K-value of from about 10 to about 17, of from about 11 to about 16, or of from about 12 to about 15.

In one embodiment, the polylysine is modified by alkoxylation such as ethoxylation and/or reaction with monofunctional molecules such as amines, isocyanate, carboxylic acids, alcohols such as mPEG, thiols, esters, acid chlorides, anhydrides, and carbonates.

The polylysine may be functionalized with fatty acid(s) as described in WO 2010/206750. Such fatty acids may be selected from $C_8$ to $C_{24}$ fatty acids, preferably $C_{12}$ to $C_{18}$ fatty acids, most preferably lauric acid, stearic acid, or oleic acid.

Particularly preferred is a non-crosslinked polylysine oleate having a weight-average molecular weight in the range of about 2000 g/mol to about 4000 g/mol. In one embodiment, said polylysine oleate has a polydispersity index (PDI) of about 1.5 to about 2.2. Further preferred is a non-crosslinked polylysine laurate having a weight-average molecular weight of about 2000 g/mol to about 4000 g/mol. In one embodiment, said polylysine laurate has a polydispersity index (PDI) of about 1.5 to about 2.2.

The polylysine may be present in the etching composition in an amount of from about 0.1 to about 10% by weight, preferably of from about 0.2 to about 5% by weight, more preferably of from about 0.5 to about 2% by weight, most preferably of from about 0.7 to about 1.5% by weight.

Ammonia

In a preferred embodiment ammonia is added to the etching composition, preferably in the form of ammonia water.

It was found that increasing the ammonia content generally reduces the etching of silicon dioxide or silicon nitride.

Ammonia may be added in an amount of from about 0.001 to about 15 mol/l, preferably of from about 0.01 to about 4 mol/l, more preferably of from about 0.02 to about 2.0 mol/l, most preferably of from about 0.03 to about 0.6 mol/l.

Preferably the molar ratio of ammonia to the etchant, particularly HF, is of from 1:1 to 5:1, more preferably of from 2:1 to 4:1. Using a molar ratio of ammonia to the etchant of 2:1 to 4:1 provides a better selectivity performance compared to other ratios.

Organic Solvents

The etching composition may optionally comprise one or more solvents.

In individual cases, a composition according to the invention as defined herein may further comprise as an optional additional component: One or more water-miscible organic solvents, preferably selected from the group consisting of tetrahydrofuran (THF), N-methylpyrrolidone (NMP), di-methyl formamide (DMF), dimethyl sulfoxide (DMSO), ethanol, isopropanol, butyldiglycol, butylglycol, sulfolane (2,3,4,5-tetrahydrothiophene-1,1-dioxide) and mixtures thereof; more preferably selected from the group consisting of THF, NMP, DMF, DMSO, sulfolane and mixtures thereof.

The term "water-miscible organic solvent" in the context of the present invention preferably means that an organic solvent fulfilling this requirement is miscible with water at least in a 1:1 (w/w) ratio at 20° C. and ambient pressure. Preferably the or at least one water-miscible organic solvent (H) is sulfolane. Particularly, preferred are compositions according to the present invention which do not comprise one or more water-miscible organic solvents.

In individual cases, a composition according to the invention as defined herein (or a composition according to the invention as described above or below as being preferred) is preferred wherein the total amount of the one or more water-miscible organic solvents, (i.e. the solvent component) present in an amount of from about 0.1 to about 30% by weight, preferably of from about 0.5 to about 10% by weight, more preferably of from about 1 to about 7.5% by weight, even more preferably of from about 1 to about 6% by weight, based on the total weight of the composition.

Most preferably the etching composition is an aqueous solution that is essentially free of organic solvents.

Chelating Agents

The etching composition may optionally comprise one or more chelating agents.

Preferred chelating agents are of 1,2-cyclohexylenedini-trilotetraacetic acid, 1,1,1,5,5,5-hexafluoro-2,4-pentane-di-one, acetylacetonate, 2,2'-azanediyldiacetic acid, ethylene-diaminetetra-acetic acid, etidronic acid, methanesulfonic acid, acetylacetone, 1,1,1-trifluoro-2,4-pentanedione, 1,4-benzoquinone, 8-hydroxyquinoline, salicyli-dene aniline; tetrachloro-1,4-benzoquinone, 2-(2-hydroxyphenyl)-benzo-xazol, 2-(2-hydroxyphenyl)-benzothiazole, hydroxyquino-line sulfonic acid, sulfosali-cylic acid, salicylic acid, pyridine, 2-ethylpyridine, 2-methoxypyridine, 3-methoxypyridine, 2-picoline, dimethylpyridine, piperidine, piperazine, tri-ethylamine, triethanolamine, ethylamine, methylamine, isobutylamine, tert-butylamine, tributylamine, dipropylamine, dimethylamine, diglycol amine, monoethanolamine, methyldiethanolamine, pyrrole, isoxazole, bipyridine, py-rimidine, pyrazine, pyridazine, quinoline, isoquinoline, indole, 1-methylimidazole, diisopropylamine, diisobutylamine, aniline, pentamethyldi-ethyl-enetriamine, acetoacetamide, ammonium carbamate, ammonium pyr-rolidinedithiocarbamate, dimethyl malonate, methyl acetoacetate, N-methyl acetoacetamide, tetramethylammonium thiobenzoate, 2,2,6,6-tetramethyl-3,5-heptanedione, tetramethylthiuram disulfide, lactic acid, ammonium lac-tate, formic acid, propionic acid, gamma-butyrolactone, and mixtures thereof;

The chelating agent may be 1,2-cyclohexylenedinitrilotetraacetic acid (CDTA) or may comprise CDTA as well as one or more of the other chelating agents above. Compositions according to the invention comprising CDTA as chelating agent have shown a stable and reproducible controlled (selective) etch rate for etching a layer comprising or consisting of an aluminium compound, in particular of aluminium oxide, in the presence of a layer of a low-k material and/or a layer comprising copper and/or cobalt, in particular in the presence of a layer of a low-k material and/or a copper layer: said etch rate on semi-conductor wafers was found to be uniform over a single wafer, with few or no centre-edge effects, and between different wafers.

A composition according to the invention as defined herein is also preferred wherein the amount of the one or more chelating agents present is of from about 0.01 to about 4% by weight, preferably of from about 0.02 to about 1% by weight, more preferably of from about 0.05 to about 0.8% by weight, based on the total weight of the composition.

Surfactants

The composition may also further comprise one or more surfactants.

Preferred surfactants are selected from the group consisting of
(i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts, PNAAS), perfluorooctanesulfonate, perfluorobutanesulfonate, perfluorononanoate and perfluorooctanoate; alkyl-aryl ether phosphates and alkyl ether phosphates,
(ii) zwitterionic surfactants, preferably selected from the group consisting of (3-[(3-cholamidopropyl)dimethylammonio]-1-propanesulfonate) ("CHAPS"), cocamidopropyl hydroxysultaine (CAS RN 68139-30-0), {[3-(dodecanoylamino)propyl](dimethyl)-ammonio}acetate, phosphatidylserine, phosphatidylethanolamine, phosphatidylcholine and
(iii) non-ionic surfactants, preferably selected from the group consisting of glucoside alkyl ethers, glycerol alkyl ethers, cocamide ethanolamines and lauryldimethylaminoxide.

More preferred surfactants in compositions according to the invention are or comprise perfluorinated, N-substituted alkylsulfonamide ammonium salts. Preferred surfactants (E) in compositions according to the invention do not comprise metals or metal ions.

A composition according to the invention as defined herein is also preferred wherein the amount of the one or more surfactants of the surfactant present is of from about 0.0001 to about 1% by weight, preferably of from about 0.001 to about 0.5% by weight, more preferably in an amount of from about 0.002 to about 0.1% by weight, based on the total weight of the composition.

Composition

In a preferred embodiment the pH of the etching composition is of from 1 to 5, particularly of from 2 to 4.5.

A composition is particularly preferred wherein the composition comprises or consists of
(a) one or more oxidizing agents, selected from a peroxide, and preferably the one or more oxidizing agent consist of or comprise hydrogen peroxide and peroxyacetic acid, in an amount of from about 0.01 to about 3.0 mol/l, preferably of from about 0.05 to about 2.0 mol/l, more preferably of from about 0.1 to about 1.5 mol/l, most preferably of from about 0.2 to about 1.0 mol/l;
(b) one or more etchants comprising a source of fluoride ions, selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof, and preferably consists of or comprises ammonium fluoride, hydrogen fluoride or a combination thereof, in an amount of from about 0.01 to about 3.0 mol/l, preferably of from about 0.05 to about 2.0 mol/l, more preferably of from about 0.1 to about 1.5 mol/l, most preferably of from about 0.2 to about 1.0 mol/l;
(c) one or more acids selected from an inorganic acid and an organic acid, particularly sulfuric acid, acidic acid, or a combination thereof and preferably consists of or comprises sulfuric acid and acidic acid in an amount of from 10 to about 60% by weight, preferably of from about 20 to about 55% by weight, more preferably of from about 30 to about 50% by weight, most preferably of from about 35 to about 45% by weight;
(d) one or more PVP as SiGe selectivity enhancer in an amount of from 0.01 to about 10% by weight, preferably of from about 0.1 to about 5% by weight, more preferably of from about 0.2 to about 3% by weight, most preferably of from about 0.5 to about 2% by weight;
(e) optionally one or more polylysine as SiGe selectivity enhancer in an amount of from 0.1 to about 10% by weight, preferably of from about 0.2 to about 5% by weight, more preferably of from about 0.5 to about 2% by weight, most preferably of from about 0.7 to about 1.5% by weight;
(f) optionally ammonia in an amount of from about 0.001 to about 15 mol/l, preferably of from about 0.01 to about 4 mol/l, more preferably of from about 0.02 to about 2.0 mol/l, most preferably of from about 0.03 to about 0.6 mol/l;
(g) optionally one or more chelating agents selected from the group consisting of 1,2-cyclohexylenedinitrilotetraacetic acid, 1,1,1,5,5,5-hexafluoro-2,4-pentane-dione, acetylacetonate, 2,2'-azanediyldiacetic acid, ethylenediaminetetra-acetic acid, etidronic acid, methanesulfonic acid, acetylacetone, 1,1,1-trifluoro-2,4-pentanedione, 1,4-benzoquinone, 8-hydroxyquinoline, salicyli-dene aniline; tetrachloro-1,4-benzoquinone, 2-(2-hydroxyphenyl)-benzoxazol, 2-(2-hydroxyphenyl)-benzothiazole, hydroxyquinoline sulfonic acid, sulfosalicylic acid, salicylic acid, pyridine, 2-ethylpyridine, 2-methoxypyridine, 3-methoxypyridine, 2-picoline, dimethylpyridine, piperidine, piperazine, tri-ethylamine, triethanolamine, ethylamine, methylamine, isobutylamine, tert-butylamine, tributylamine, dipropylamine, dimethylamine, diglycol amine, monoethanolamine, methyldiethanolamine, pyrrole, isoxazole, bipyridine, py-rimidine, pyrazine, pyridazine, quinoline, isoquinoline, indole, 1-methylimidazole, diisopropylamine, diisobutylamine, aniline, pentamethyldiethylenetriamine, acetoacetamide, ammonium carbamate, ammonium pyrrolidinedithiocarbamate, dimethyl malonate, methyl acetoacetate, N-methyl acetoacetamide, tetramethylammonium thiobenzoate, 2,2,6,6-tetramethyl-3,5-heptanedione, tetramethylthiuram disulfide, lactic acid, ammonium lactate, formic acid, propionic acid, gamma-butyrolactone, and mixtures there-of, and preferably is or comprises 1,2-cyclohexylene-dinitrilotetraacetic acid, in an amount of from about 0.01 to about 4% by weight, preferably in a total amount of from about 0.02 to about 1% by weight, more preferably in a total amount of from about 0.05 to about 0.8% by weight, based on the total weight of the composition;

(h) optionally one or more surfactants selected from the group consisting of (i) anionic sur-factants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts), perfluorooctanesulfonate, perfluorobutanesulfonate, perfluorononanoate and perfluorooctanoate; alkyl-aryl ether phosphates and alkyl ether phosphates, (ii) zwitterionic surfac-tants, preferably selected from the group consisting of (3-[(3-cholamidopropyl)dimethylammonio]-1-propanesulfonate), cocamidopropyl hydroxysultaine, {[3-(dodecanoylamino)propyl](dimethyl)ammonio}acetate, phosphatidylserine, phosphatidylethanolamine, phosphatidylcholine, (iii) non-ionic surfactants, preferably selected from the group consisting of glucoside alkyl ethers, glycerol alkyl ethers, cocamide ethanolamines and lauryldimethylaminoxide; and preferably the one or more surfactants are or comprise perfluorinated, N-substituted alkylsulfonamide ammonium salts, in an amount of from 0.0001 to 1% by weight, preferably in an amount of from about 0.001 to about 0.5% by weight, more preferably in an amount of from about 0.002 to about 0.1% by weight;

(i) water as balance to a total of 100 wt.-% of the composition in each case; and (k) optionally one or more water-miscible organic solvents, preferably selected from the group consisting of tetrahydrofuran (THF), N-methylpyrrolidone (NMP), di-methyl formamide (DMF), dimethyl sulfoxide (DMSO) and sulfolane (2,3,4,5-tetrahydrothiophene-1,1-dioxide) and mixtures thereof, in an amount of from about 0.1 to about 30% by weight, preferably of from about 0.5 to about 10% by weight, more preferably of from about 1 to about 7.5% by weight, even more preferably of from about 1 to about 6% by weight;

all based on the total weight of the composition, wherein the pH of the composition is of from about 0 to about 5, preferably of from about 2 to about 4, and wherein the % amounts of the components add to 100% by weight in each case.

Another composition is particularly preferred wherein the composition comprises or consists of (a) an oxidizing agent selected from a combination of
 (i) hydrogen peroxide in a total amount of from 0.01 to 8% by weight, preferably of from about 0.1 to about 5% by weight, more preferably of from about 0.2 to about 2% by weight, and
 (ii) peroxyacetic acid in a total amount of from about 0.01 to about 15% by weight, preferably of from about 0.2 to about 10% by weight, more preferably of from about 0.5 to about 5% by weight;

(b) one or more etchants comprising fluoride anions, selected from the group consisting of ammonium fluoride, ammonium bifluoride, hydrogen fluoride, and mixtures thereof, and preferably consists of or comprises hydrogen fluoride, in an amount of from about 0.05 to about 2.0 mol/l, preferably of from about 0.1 to about 1.5 mol/l, most preferably of from about 0.2 to about 1.0 mol/l;

(c) an acid selected from a combination of
 (i) an inorganic acid in an amount of from 1% by weight or below, more preferably about 0.5% by weight or below, most preferably of from about 0.1 to about 0.5% by weight and
 (ii) an organic acid in an amount of from about 10 to about 60% by weight, more preferably of from about 20 to about 55% by weight, most preferably of from about 30 to about 50% by weight;

(d) one or more PVP as SiGe selectivity enhancer having a weight-average molecular weight $M_w$ of from about 3 to about 3 000 kg/mol, preferably from about 4 to about 1 700 kg/mol, more preferably from about 4 to about 500 kg/mol, even more preferably from about 5 to about 100 kg/mol, most preferably from about 5 to about 50 kg/mol, in an amount of from about 0.01 to about 10% by weight, preferably of from about 0.1 to about 5% by weight, more preferably of from about 0.2 to about 3% by weight, most preferably of from about 0.5 to about 2% by weight;

(e) optionally one or more polylysine as SiGe selectivity enhancer having a weight average molecular weight $M_w$ of about 1000 g/mol to about 60 000 g/mol, preferably of about 1000 g/mol to about 5000 g/mol, more preferably of about 2000 g/mol to about 4000 g/mol, most preferably of about 2500 g/mol to about 3500 g/mol in an amount of from about 0.1 to about 10% by weight, preferably of from about 0.2 to about 5% by weight, more preferably of from about 0.5 to about 2% by weight, most preferably of from about 0.7 to about 1.5% by weight;

(f) optionally ammonia in an amount of from about 0.001 to about 15 mol/l, preferably of from about 0.01 to about 4 mol/l, more preferably of from about 0.02 to about 2.0 mol/l, most preferably of from about 0.03 to about 0.6 mol/l;

(g) optionally one or more chelating agents selected from the group consisting of 1,2-cyclohexylenedinitrilotetraacetic acid, 1,1,1,5,5,5-hexafluoro-2,4-pentane-dione, acetylacetonate, 2,2'-azanediyldiacetic acid, ethylenediaminetetra-acetic acid, etidronic acid, methanesulfonic acid, acetylacetone, 1,1,1-trifluoro-2,4-pentanedione, 1,4-benzoquinone, 8-hydroxyquinoline, salicylidene aniline; tetrachloro-1,4-benzoquinone, 2-(2-hydroxyphenyl)-benzoxazol, 2-(2-hydroxyphenyl)-benzothiazole, hydroxyquinoline sulfonic acid, sulfosalicylic acid, salicylic acid, pyridine, 2-ethylpyridine, 2-methoxypyridine, 3-methoxypyridine, 2-picoline, dimethylpyridine, piperidine, piperazine, triethylamine, triethanolamine, ethylamine, methylamine, isobutylamine, tert-butylamine, tributylamine, dipropylamine, dimethylamine, diglycol amine, monoethanolamine, methyldiethanolamine, pyrrole, isoxazole, bipyridine, pyrimidine, pyrazine, pyridazine, quinoline, isoquinoline, indole, 1-methylimidazole, diisopropylamine, diisobutylamine, aniline, pentamethyldi-ethylenetriamine, acetoacetamide, ammonium carbamate, ammonium pyrrolidinedithiocarbamate, dimethyl malonate, methyl acetoacetate, N-methyl acetoacetamide, tetramethylammonium thiobenzoate, 2,2,6,6-tetramethyl-3,5-heptanedione, tetramethylthiuram disulfide, lactic acid, ammonium lactate, formic acid, propionic acid, gamma-butyrolactone, and mixtures there-of, and preferably is or comprises 1,2-cyclohexylenedinitrilotetraacetic acid, in a total amount of from about 0.02 to about 1% by weight, preferably in a total amount of from about 0.05 to about 0.8% by weight;

(h) optionally one or more surfactants selected from the group consisting of (i) anionic sur-factants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts), perfluorooctanesulfonate, perfluorobutanesulfonate, perfluorononanoate and perfluorooctanoate; alkyl-aryl ether phosphates and alkyl ether phosphates, (ii) zwitterionic surfac-tants, preferably selected from the group consisting of (3-[(3-cholamidopropyl)dimethylammonio]-1-propanesulfonate), cocamidopropyl hydroxysultaine, {[3-(dodecanoylamino)propyl](dimethyl)ammonio}acetate, phosphatidylserine, phosphatidylethanolamine, phosphatidylcholine, (iii) non-ionic surfactants, preferably selected from the group consisting of glucoside alkyl ethers, glycerol alkyl ethers, cocamide ethanolamines and lauryldimethylaminoxide; and preferably the one or more surfactants are or comprise perfluorinated, N-substituted alkylsulfonamide ammonium salts, in a total amount of from about 0.001 to about 0.5% by weight, preferably in a total amount of from about 0.002 to about 0.1% by weight;

(i) water as balance to a total of 100% by weight of the composition in each case, and (k) optionally one or more water-miscible organic solvents, preferably selected from the group consisting of tetrahydrofuran (THF), N-methylpyrrolidone (NMP), di-methyl formamide (DMF), dimethyl sulfoxide (DMSO) and sulfolane (2,3,4,5-tetrahydrothiophene-1,1-dioxide) and mixtures thereof, in an amount of from about 0.5 to about 10% by weight, preferably of from about 1 to about 7.5% by weight, even more preferably of from about 1 to about 6% by weight;

all based on the total weight of the composition, wherein the pH of the composition is of from 1 to 5, preferably of from 2 to 4, and wherein the % amounts of the components add to 100% by weight in each case.

Yet another composition is particularly preferred wherein the composition comprises or consists of (a) an oxidizing agent, selected from a combination of
  (i) hydrogen peroxide in a total amount of from about 0.1 to about 5% by weight, more preferably of from about 0.2 to about 2% by weight, and
  (ii) peroxyacetic acid in a total amount of from about 0.2 to about 10% by weight, more preferably of from about 0.5 to about 5% by weight;

(b) an etchant consisting of hydrogen fluoride, in an amount of from about 0.01 to about 5% by weight, preferably of from about 0.1 to about 2% by weight, more preferably of from about 0.1 to about 1% by weight, most preferably of from about 0.1 to about 0.5% by weight;

(c) an acid selected from a combination of
  (i) sulfuric acid in an amount of from 1% by weight or below, more preferably about 0.5% by weight or below, most preferably of from about 0.1 to about 0.5% by weight and
  (ii) acidic acid in an amount of from about 10 to about 60% by weight, more preferably of from about 20 to about 55% by weight, most preferably of from about 30 to about 50% by weight;

(d) one or more PVP as SiGe selectivity enhancers having a weight-average molecular weight $M_w$ of the PVP may be from about 3 to about 3 000 kg/mol, preferably from about 4 to about 1 700 kg/mol, more preferably from about 4 to about 500 kg/mol, even more preferably from about 5 to about 100 kg/mol, most preferably from about 5 to about 50 kg/mol in an amount of from about 0.01 to about 10% by weight, preferably of from about 0.1 to about 5% by weight, more preferably of from about 0.2 to about 3% by weight, most preferably of from about 0.5 to about 2% by weight;

(e) optionally one or more polylysine as SiGe selectivity enhancer having a weight average molecular weight $M_w$ of about 1000 g/mol to about 60 000 g/mol, preferably of about 1000 g/mol to about 5000 g/mol, more preferably of about 2000 g/mol to about 4000 g/mol, most preferably of about 2500 g/mol to about 3500 g/mol in an amount of from about 0.2 to about 5% by weight, preferably of from about 0.5 to about 2% by weight, most preferably of from about 0.7 to about 1.5% by weight;

(f) optionally ammonia in an amount of from about 0.01 to about 2% by weight, preferably of from about 0.01 to about 1.5% by weight, more preferably of from about 0.05 to about 1% by weight, most preferably of from about 0.1 to about 0.8% by weight;

(g) water as balance to a total of 100% by weight of the composition in each case;

all based on the total weight of the composition, wherein the pH of the composition is of from 1 to 5, preferably of from 2 to 4, and wherein the % amounts of the components add to 100% by weight in each case.

A composition according to the invention as defined herein is specifically preferred wherein the composition consists of hydrogen peroxide, peroxyacetic acid, sulfuric acid, hydrogen fluoride, ammonia, PVP, water, and optionally lysine to be defined based on the examples.

Application

It will be appreciated that it is common practice to make concentrated forms of the compositions to be diluted prior to use. For example, the compositions may be manufactured in a more concentrated form and thereafter diluted with water, at least one oxidizing agent, or other components at the manufacturer, before use, and/or during use. Dilution ratios may be in a range from about 0.1 parts diluent to 1 parts composition concentrate to about 100 parts diluent to 1 part composition concentrate.

Accordingly, one embodiment relates to a kit including, in one or more containers, one or more components adapted to form the compositions described herein. Preferably, one container comprises the at least one oxidizing agent and a second container comprises the remaining components, e.g., at least one etchant, at least one PVP, water, and optionally other components described herein, for combining at the fab or the point of use. For example, in one embodiment, one container comprises the at least one peroxyacetic acid mixture and a second container comprises the remaining components, e.g., at least one etchant, at least one PVP, water, and optionally other components described herein, for combining at the fab or the point of use. Particularly if polylysine is used, the polylysine is provided separately from the other components and mixed just before use.

In the use of the compositions described herein, the composition typically is contacted with the device structure for a sufficient time of from about 1 minute to about 200 minutes, preferably about 5 minutes to about 60 minutes, at temperature in a range of from about 10° C. to about 80° C., preferably about 20° C. to about 60° C. Such contacting times and temperatures are illustrative, and any other suitable time and temperature conditions may be employed that are efficacious to achieve the required removal selectivity.

Following the achievement of the desired etching action, the composition can be readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water, an organic solvent, and/or dried (e.g., spin-dry, $N_2$, vapor-dry etc.).

It may be useful to clean the blanket wafer surfaces for approx 30 s with an aqueous solution containing 0.3% by weight HF at room temperature.

The etching composition described herein may be advantageously used for selectively etching a layer comprising SiGe in the presence of a silicon-containing layer, particularly a layer comprising or consisting of a-Si, $SiO_x$, SiN, SiON, or a combination thereof.

The etching composition described herein may be advantageously used in a process of selectively removing a layer comprising silicon-germanium from a surface of a microelectronic device relative to a silicon-containing layer, particularly a layer comprising or consisting of a-Si, $SiO_x$, SiN, or SiON, or a combination thereof, the process comprising:
(a) providing a microelectronic device surface that includes silicon and silicon-germanium,
(b) providing a composition as described herein, and
(c) contacting the surface with the composition for a time and at a temperature effective to selectively remove the layer comprising silicon-germanium relative to the silicon-containing layer.

Preferably the etch rate of the layer comprising silicon-germanium is at least 10, preferably 20, even more preferably 50, most preferably 100 times faster that the etch rate of the silicon-containing layer, particularly a layer comprising or consisting of a-Si, $SiO_x$, SiN, or SiON, or a combination thereof.

The etching composition described herein may be advantageously used in a process for the manufacture of a semiconductor device, comprising the step of selectively removing silicon-germanium from a surface of a microelectronic device relative to a silicon-containing material described herein.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

The film thicknesses were measured by ellipsometry using an M2000 Elipsometer from Woolam.
The following substrates were used:
20 nm amorphous silicon on 1 nm $SiO_2$ on Silicon from IMEC
100 nm $SiO_2$ on Silicon from Ramco
500 nm SiN on Silicon from Ramco
SiGe with 25% Germanium in a Silicon Germanium alloy layer on Silicon from Ramco
The following materials were used in electronic grade purity:
Acetic Acid (99-100%)
$H_2O_2$ (31%)
$H_2SO_4$ (96%)
$NH_4OH$ (28%)
HF (50%)
Luviskol® K 17 (BASF Quality)
Polylysine with K value of 12-15 (as described in WO2016/062578)
Water (Ultrapure)
All amounts given for the compounds in the composition are absolute amounts, i.e. excluding water, in the overall mixture.

In a first step, a peracetic acid mixture was prepared
The following table summarizes the required amounts used to receive 850 g of peracetic acid mixture:

| | concentration | mass [g] | % by weight |
|---|---|---|---|
| Acetic Acid | 100.0% | 458.91 | 54.0% |
| $H_2O_2$ | 31.0% | 382.23 | 13.9% |
| $H_2SO_4$ | 96.0% | 8.86 | 1.00% |

The raw materials were mixed at room temperature (20-25° C.) in the order of appearance in the table above. The above-mentioned mixture was stored in an appropriate storage cabinet excluding light. It equilibrated slowly at room temperature to the peroxyacetic acid (PAA) solution as listed in the table below.

| | |
|---|---|
| Acetic Acid | 41.5% |
| $H_2O_2$ | 6.8% |
| Peroxyacetic Acid | 15.9% |
| $H_2O$ | 34.8% |
| $H_2SO_4$ | 1.00% |

After 1 day of equilibration 85% of the PAA was generated and the mixture could be used from there on. After 2-3 days 90 to 95% were reached and after 4-5 days the mixture has reached equilibrium state. The mixture was stable for at least 2 months.

The raw materials were mixed according to the weight content described in table 1 at room temperature with no special order of mixing. The formulation was then cooled or heated to the described temperature.

TABLE 1

| | 1 | comp 2 | 3 | comp 4 | 5 |
|---|---|---|---|---|---|
| PAA mixture | 20.5% | 20.5% | 20.5% | 20.5% | 20.5% |
| Acetic Acid | 39.5% | 39.5% | 39.5% | 39.5% | 39.5% |
| $NH_4OH$ | 0.24% | 0.24% | 0.71% | 0.71% | 0.71% |
| HF | 0.14% | 0.14% | 0.14% | 0.14% | 0.14% |
| Luviskol ® K 17 (PVP) | 1.0% | | 1.0% | | 1.0% |
| Polylysine | | | | | 1.0% |
| Water | 38.6% | 39.6% | 38.2% | 39.2% | 37.2% |

Example 1 (Without Polylysine)

The substrates were etched at 35° C. by dipping the substrate into the etching solution according to table 1 for a time provided in table 3a, washed with water and dried with air. The etching rates were determined by Ellipsometry by comparing the layer thickness before and after etching. The results are depicted in table 2a.

TABLE 2a

| | 1 | comp 2 | 3 | comp 4 |
|---|---|---|---|---|
| aSi (300 s) | 3.2 | 13.0 | 1.0 | 21.6 |
| $SiO_2$ (600 s) | 3.2 | 6.3 | 0.6 | 2.6 |
| SiGe (30 s) | 44 | 124 | 28 | 98 |
| SiGe (60 s) | 94 | 167 | 68 | 150 |

The selectivities are given in table 2b.

TABLE 2b

|  | 1 | comp 2 | 3 | comp 4 |
|---|---|---|---|---|
| SiGe (30 s)/aSi (300 s) | 14 | 10 | 28 | 5 |
| SiGe (60 s)/aSi (300 s) | 29 | 13 | 68 | 7 |
| SiGe (30 s)/SiO$_2$ (600 s) | 14 | 20 | 47 | 38 |
| SiGe (60 s)/SiO$_2$ (600 s) | 29 | 27 | 113 | 58 |

Tables 2a and 2b show that the PVP improves the selectivities SiGe vs. a-Si and SiGe vs. SiO$_2$, particularly when increasing the ammonia to HF ratio.

Example 2 (With Polylysine)

The substrates were etched at 20° C. by dipping the substrate into the etching solution according to table 1 for a time provided in table 4a, washed with water and dried with air. The etching rates were determined by Ellipsometry by comparing the layer thickness before and after etching. The results are depicted in table 3a.

TABLE 3a

|  | 3 | 5 |
|---|---|---|
| aSi (900 s) | 0.93 | 0.87 |
| SiO$_2$ (1800 s) | 0.50 | 0.37 |
| SiGe (90 s) | 47 | 69 |
| SiGe (120 s) | 43 | 63 |

The selectivities are given in table 3b.

TABLE 3b

|  | 3 | 5 |
|---|---|---|
| SiGe (90 s)/aSi (900 s) | 50 | 80 |
| SiGe (120 s)/aSi (900 s) | 46 | 73 |
| SiGe (90 s)/SiO2 (1800 s) | 93 | 189 |
| SiGe (120 s)/SiO2 (1800 s) | 86 | 172 |

Tables 3a and 3b show that the PVP improves the selectivities significantly, both SiGe vs. aSi and SiGe vs. SiO$_2$

The invention claimed is:

1. A composition for selectively etching a layer comprising a silicon germanium alloy (SiGe) in the presence of a silicon-containing layer, the composition comprising:
   (a) 0.01 to 3.0 mol/l of a peroxide,
   (b1) 1% by weight or below of an inorganic acid having a pK$_a$ of 2 or less,
   (b2) 10 to 60% by weight of an organic acid selected from a C$_1$ to C$_{10}$ mono, di or tri carboxylic acid, a C$_1$ to C$_{10}$ sulfonic acid, and a C$_1$ to C$_{10}$ phosphonic acid,
   (c) 0.001 to 3 mol/l of an etchant selected from the group consisting of hydrogen fluoride, ammonium fluoride, ammonium bifluoride, triethanolammonium fluoride, diglycolammonium fluoride, methyldiethanolammonium fluoride, tetramethylammonium fluoride, triethylamine tri-hydrofluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate, and mixtures thereof,
   (d) 0.01 to 10% by weight of a polyvinylpyrrolidone (PVP), and
   (e) water.

2. The composition according to claim 1, wherein the polyvinylpyrrolidone is present in an amount of from 0.2% to about 3% by weight.

3. The composition according to claim 1, wherein the pH of the composition is of from 1 to 5.

4. The composition according to claim 1, wherein the peroxide is selected from the group consisting of hydrogen peroxide, peroxyacetic acid, and a combination thereof.

5. The composition according to claim 1, wherein the peroxide is a peroxyacetic acid mixture prepared by mixing and having reacted acetic acid, hydrogen peroxide and a strong inorganic acid.

6. The composition according to claim 1, wherein the total amount of the peroxide is of from 0.1 to about 1.5 mol/l.

7. The composition according to claim 1, wherein the etchant is present in an amount of from 0.01 to about 0.5 mol/l.

8. The composition according to claim 1, further comprising ammonia.

9. The composition according to claim 8, wherein the weight ratio of the ammonia to the etchant is of from 2:1 to 4:1.

10. The composition according to claim 1, further comprising a polylysine.

11. The composition according to claim 1, wherein the silicon-containing layer comprises a Si, SiO$_x$, SiON, SiN, or a combination thereof.

12. The composition according to claim 1, wherein the pH of the composition is of from 2 to 4.5.

13. The composition according to claim 1, wherein the total amount of the peroxide is of from 0.2 to about 1.0 mol/l.

14. The composition according to claim 1, wherein the etchant is hydrogen fluoride.

15. The composition according to claim 1, further comprising ammonia in an amount of from 0.02 to about 2.0 mol/l.

16. A method of using the composition according to claim 1, the method comprising using the composition for selectively etching a layer comprising SiGe in the presence of a silicon-containing layer.

17. A process of selectively removing a layers comprising a silicon germanium alloy from a surface of a microelectronic device relative to a silicon-containing layer, the process comprising:
   (a) providing a microelectronic device surface that includes the layer comprising the silicon germanium alloy and the silicon-containing layer,
   (b) providing the composition according to claim 1, and
   (c) contacting the surface with the composition for a time and at a temperature effective to selectively remove the layer comprising silicon-germanium relative to the silicon-containing layer.

18. A process for the manufacture of a semiconductor device, comprising the step of selectively removing silicon-germanium from a surface of a microelectronic device relative to a silicon-containing material according to claim 17.

* * * * *